United States Patent
Kaneko et al.

(10) Patent No.: US 9,053,961 B2
(45) Date of Patent: Jun. 9, 2015

(54) SEMICONDUCTOR DEVICE AND METHOD OF MANUFACTURING THE SEMICONDUCTOR DEVICE

(71) Applicant: Renesas Electronics Corporation, Kanagawa (JP)

(72) Inventors: Kishou Kaneko, Kanagawa (JP); Naoya Inoue, Kanagawa (JP); Yoshihiro Hayashi, Kanagawa (JP)

(73) Assignee: RENESAS ELECTRONICS CORPORATION, Kanagawa (JP)

(*) Notice: Subject to any disclaimer, the term of this patent is extended or adjusted under 35 U.S.C. 154(b) by 126 days.

(21) Appl. No.: 13/680,757

(22) Filed: Nov. 19, 2012

(65) Prior Publication Data
US 2013/0153887 A1 Jun. 20, 2013

(30) Foreign Application Priority Data
Dec. 14, 2011 (JP) ................. 2011-273229

(51) Int. Cl.
| H01L 27/088 | (2006.01) |
| H01L 29/66  | (2006.01) |
| H01L 27/12  | (2006.01) |
| H01L 23/522 | (2006.01) |

(52) U.S. Cl.
CPC ........ *H01L 27/088* (2013.01); *H01L 29/66477* (2013.01); *H01L 27/1218* (2013.01); *H01L 27/1225* (2013.01); *H01L 27/1237* (2013.01); *H01L 27/124* (2013.01); *H01L 27/1251* (2013.01); *H01L 23/522* (2013.01)
USPC ................... 257/43; 257/59; 257/72

(58) Field of Classification Search
CPC ........................ H01L 27/088; H01L 29/66477
USPC ................................ 257/43, 59, 72
See application file for complete search history.

(56) References Cited

U.S. PATENT DOCUMENTS

| 8,378,341 B2 | 2/2013 | Hayashi et al. |
| 8,461,586 B2* | 6/2013 | Yamazaki et al. .............. 257/43 |
| 8,581,257 B2 | 11/2013 | Murai et al. |
| 2010/0148171 A1 | 6/2010 | Hayashi et al. |
| 2011/0073918 A1* | 3/2011 | Makita .......................... 257/255 |

FOREIGN PATENT DOCUMENTS

| JP | 2010-141230 | 6/2010 |
| WO | WO 2011/125353 | 10/2011 |

OTHER PUBLICATIONS

Japanese Office Action dated Mar. 17, 2015 in corresponding Japanese Patent Application No. 2011-273229 with English translation of Japanese Office Action.

* cited by examiner

*Primary Examiner* — Tran Tran
(74) *Attorney, Agent, or Firm* — Young & Thompson (57) ABSTRACT

An interlayer insulating film is formed. Then a first gate electrode and a second gate electrode are buried in the interlayer insulating film. Then, an anti-diffusion film is formed over the interlayer insulating film, over the first gate electrode, and over the second gate electrode. Then, a first semiconductor layer is formed over the anti-diffusion film which is present over the first gate electrode. Then, an insulating cover film is formed over the upper surface and on the lateral side of the first semiconductor layer and over the anti-diffusion film. Then, a semiconductor film is formed over the insulating cover film. Then, the semiconductor film is removed selectively to leave a portion positioned over the second gate electrode, thereby forming a second semiconductor layer.

13 Claims, 12 Drawing Sheets

SEMICONDUCTOR DEVICE AND METHOD OF MANUFACTURING THE SEMICONDUCTOR DEVICE

CROSS-REFERENCE TO RELATED SPECIFICATIONS

The disclosure of Japanese Patent Application No. 2011-273229 filed on Dec. 14, 2011 including the specification, drawings, and abstract is incorporated herein by reference in its entirety.

BACKGROUND

The present invention concerns a semiconductor device having transistors in an interconnect layer and a method of manufacturing the semiconductor device.

Japanese Unexamined Patent Application Publication No. 2010-141230 describes that a semiconductor film is formed in an interconnect layer and transistors are formed by using the semiconductor film and the interconnect of the interconnect layer. In the transistor, the interconnect positioned below the semiconductor film is used as a gate electrode and anti-diffusion film between the interconnect layers is used as a gate insulating film.

SUMMARY

For improving the degree of freedom in the circuit design, it is preferred to form a plurality types of transistors in one identical layer. For changing the type of the transistors, the type of the semiconductor layer as a channel is preferably changed. However, when it is intended to form a plurality type of semiconductor layers in one identical layer, if the plurality of semiconductor layers are in contact to each other upon deposition, there may be a possibility that the characteristics of the semiconductor layers are changed.

According to one aspect of the present invention, a semiconductor device includes: a multilayer interconnect layer having a first interconnect layer and a second interconnect layer positioned over the first interconnect layer; and a first transistor and a second transistor formed by using the first interconnect layer, and the first transistor has: a first gate electrode buried in the first interconnect layer; a first gate insulating film positioned over the first gate electrode; a first semiconductor layer positioned over the first gate insulating film; and an insulating cover film positioned below the second interconnect layer and covering the upper surface and the lateral side of the first semiconductor layer, and the second transistor has: a second gate electrode buried in the first interconnect layer; a second gate insulating film positioned over the second gate electrode; and a second semiconductor layer positioned over the second gate insulating film, at least partially positioned over the insulating cover film, and comprising a material different from that of the first semiconductor layer.

According to another aspect of the present invention, a method of manufacturing a semiconductor device includes: burying a first gate electrode and the second gate electrode in the first interlayer insulating film; forming a first gate insulating film and a first semiconductor layer over the first gate electrode; forming an insulating cover film over the upper surface and on the lateral side of the first semiconductor layer; forming a second semiconductor layer over the insulating cover film and over the second gate electrode, and selectively removing the second semiconductor layer while leaving a portion of the second semiconductor layer positioned over the second gate electrode.

Since the aspects of the present invention can prevent contact between the first semiconductor layer and the second semiconductor layer from to each other, change of the characteristics of the first transistor and the second transistor can be suppressed.

DETAILED DESCRIPTION

Preferred embodiments of the present invention will be described with reference to the drawings. Throughout the drawings, identical configurational factors carry the same reference numerals, for which description is optionally omitted.

First Embodiment

Figure 1:
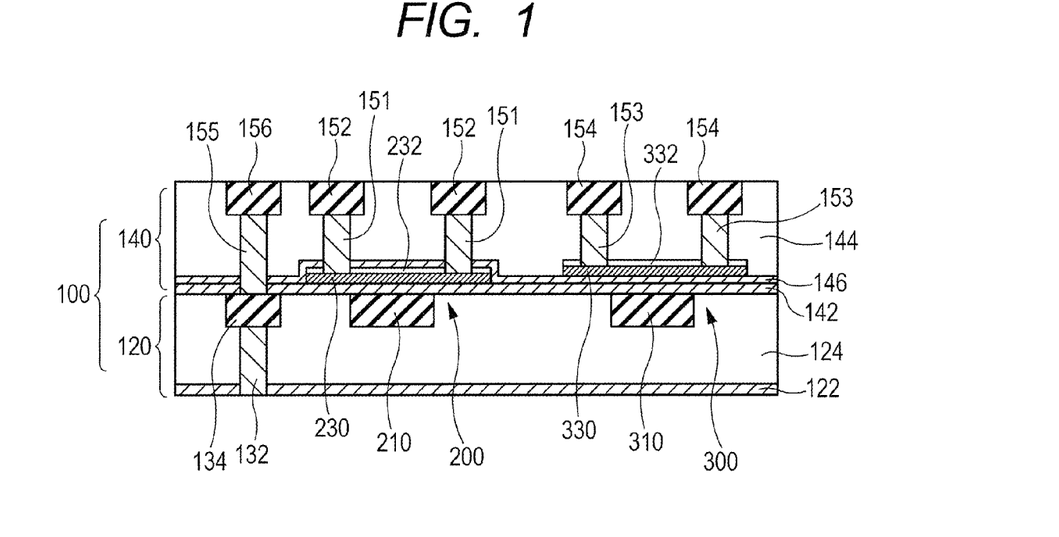
FIG. 1 is a cross sectional view showing a configuration of a semiconductor device according to a first embodiment.

FIG. 1 is a cross sectional view showing a configuration of a semiconductor device according to a first embodiment. The semiconductor device has a multilayer interconnect layer 100. The multilayer interconnect layer 100 has a first interconnect layer 120 and a second interconnect layer 140. The first interconnect layer 120 is formed by stacking an interlayer insulating film 124 over an anti-diffusion film 122. The second interconnect layer 140 is formed over the first interconnect layer 120 and formed by stacking an interlayer insulating film 144 over an anti-diffusion film 144.

The anti-diffusion films 122 and 142 include insulating films containing at least two elements of Si, C, and N, for example, SiN film, SiCN film, or SiC film. The anti-diffusion films 122 and 142 may also be a stacked film of stacking at least two films described above. The thickness of the anti-diffusion films 122 and 142 is, for example, 10 nm or more and 50 nm or less.

The interlayer insulating films 124 and 144 are, for example, silicon oxide or low k insulating film comprising, for example having an dielectric constant lower than that of silicon oxide having a specific dielectric constant of 2.7 or lower. The low k insulating film is a carbon-containing film, for example, SiOC film, SiOCH film, SiLK (registered trademark), HSQ (hydrogen silsesquioxane) film, MHSQ (methylated hydrogen silsesquioxane) film, MSQ (methyl silsesquioxane) film, or a porous film thereof.

A via 132 and an interconnect 134 are buried in the interlayer insulating film 124. The via 132 and the interconnect 134 are formed, for example, of a metal material comprising copper as a main ingredients (95% or more). The via 132 and the interconnect 134 may be formed by a single damascene method of a dual damascene method. The via 132 may also be a contact.

The multilayer interconnect layer 100 is formed over a semiconductor substrate such as a silicon substrate (not illustrated in the drawing). Elements, for example, transistors are formed to the semiconductor substrate. The semiconductor substrate and the transistor are to be described in other embodiments to be described later.

The multilayer interconnect layer 100 has a first transistor 200 and a second transistor 300.

The first transistor 200 has a first gate electrode 210 and a first semiconductor layer 230. The first gate electrode 210 is formed in a step identical with that of the interconnect 134. That is, the first gate electrode 210 is formed of a metal material comprising copper as a main ingredient (95% or more) and buried in the first interconnect layer 120. The first semiconductor layer 230 is formed over an anti-diffusion film 142. The first semiconductor layer 230 opposes the first gate electrode 210 by way of the anti-diffusion film 142. A portion of the anti-diffusion film 142 positioned between the first gate electrode 210 and the first semiconductor layer 230 functions as a gate insulating film of the first transistor 200.

A hard mask 232 is formed over the first semiconductor layer 230. The hard mask 232 is used for leaving the first semiconductor layer 230 selectively by etching. Therefore, the planar shape of the hard mask 232 and that of the first semiconductor layer 230 is identical. The hard mask 232 may be any material so long as an etching selectivity is obtainable relative to the first semiconductor layer 230.

An insulating cover film 146 is formed over the hard mask 232 and the anti-diffusion film 142. The insulating cover film 146 also covers the upper surface and the lateral side of the hard mask 232 and the lateral side of the first semiconductor layer 230. The insulating cover film 146 includes one of SiN film, $SiO_2$ film, SiOC film, and SiOCH film.

The second transistor 300 has a second gate electrode 310 and a second semiconductor layer 330. The second gate electrode 310 is formed by the sane step as that of the interconnect 134 and the first gate electrode 210. That is, the second gate electrode 310 is formed of a metal material comprising copper as a main ingredient (95% or more) and buried in the first interconnect layer 120. The second semiconductor layer 330 is formed over the insulating cover film 146. The second semiconductor layer 330 is opposed to the second gate electrode 310 by way of the anti-diffusion film 142 and the insulating cover film 146. A portion of the anti-diffusion film 142 positioned between the second gate electrode 310 and the second semiconductor layer 330 functions as a gate insulating film of the second transistor 300. In the example shown in FIG. 1, portions of the anti-diffusion film 142 and the insulating cover film 146 positioned between the second gate electrode 310 the second semiconductor layer 330 function as the gate insulating film of the second transistor 300.

A hard mask 332 is formed over the second semiconductor layer 330. The hard mask 332 is used when the second semiconductor layer 330 is left selectively by etching. Therefore, the planar shape of the hard mask 332 is identical with that of the second semiconductor layer 330. The hard mask 332 may be any material so long as etching selectivity is obtainable relative to the second semiconductor layer 330.

The thickness of the first semiconductor layer 230 and the second semiconductor layer 330, for example, 10 nm or more and 300 nm or less. The first semiconductor layer 230 and the second semiconductor layer 330 each has an oxide semiconductor layer, for example, InGaZnO (IGZO) film, InZnO layer, ZnO layer, ZnAlO layer, ZnCuO layer, NiO layer, SnO layer, $SnO_2$ layer, CuO layer, $Cu_2O$ layer, CuAlO layer, ZnO layer, ZnAlO layer, $Ta_2O_5$ layer, or $TiO_2$ layer. When the first transistor 200 is an n-type transistor, the first semiconductor layer 230 is one of the InGaZnO (IGZO) layer, the InZnO layer, the ZnO layer, the ZnAlO layer, the ZnCuO layer, and the CuO layer. When the first transistor 200 is a p-type transistor, the first semiconductor layer 230 is one of the NiO layer, the SnO layer, the CuO layer, the $Cu_2O$ layer, the CuAlO layer, the ZnO layer, and the ZnAlO layer.

This is identical also for the second semiconductor layer 330. Each of first semiconductor layer 230 and the second semiconductor layer 330 may be a single layer structure of the oxide semiconductor layer described above, or a stacked structure of the oxide semiconductor layer described above and other layer. An example of the latter includes a stacked film of $IGZO/Al_2O_3/IGZO/Al_2O_3$. The first semiconductor layer 230 and the second semiconductor layer 330 may also be a polysilicon layer or an amorphous silicon layer.

The first semiconductor layer 230 and the second semiconductor layer 330 may be different in at least one of the thickness and the material. Thus, characteristics of the first transistor 200 and the second transistor 300 are different from each other.

For example, one of the first transistor 200 and the second transistor 300 is an n-channel type transistor and the other of them is a p-channel type transistor. The first transistor 200 and the second transistor 300 may have a conduction type identical with each other and, for example, each of then may be an n-type transistor. In this case, the first semiconductor layer 230 and the second semiconductor layer 330 are different from each other, for example, with respect to the thickness.

To each of the first semiconductor layer 230 and the second semiconductor layer 330, a source and a drain are provided. The method of forming the source and the drain is to be described with reference to the first semiconductor layer 230 as an example. When the first semiconductor layer 230 is an oxide semiconductor layer, the source and the drain are formed, for example, by introducing oxygen defects but they may also be formed by introducing an impurity. Further, the source and the drain may also be formed by modifying the first semiconductor layer 230 when the contact is formed. When the first semiconductor layer 230 comprises a polysilicon layer or an amorphous silicon layer, the source and the drain are formed by introducing an impurity. The width of the source and the drain in the lateral direction of the gate (that is, a direction perpendicular to the surface of the drawing sheet in FIG. 1) is, for example, 50 nm or more and 10 µm or less.

A region of the first semiconductor layer 230 put between the source and the drain defined a channel region. The channel region overlaps the first gate electrode 210 in a plan view. In the same manner, a region of the second semiconductor layer 330 put between the source and the drain defines a channel region. The channel region overlaps the second electrode 310 in a plan view.

The second interconnect layer 140 has interconnects 152, 154, and 156, and vias 151, 153, and 155. The interconnects 152, 154, and 156 are formed by a step identical with each other, and the vias 151, 153, and 155 are formed also by a step identical with each other. The interconnects and vias may also be formed by a single damascene method or a dual damascene method. The interconnects 152 are connected each by way of the via 151 to the source/drain of the first transistor 200. The interconnects 154 are connected each by way of the via 153 to the source/drain of the second transistor 300. The interconnect 156 is connected by way of the via 155 to the interconnect 134.

Figure 2:
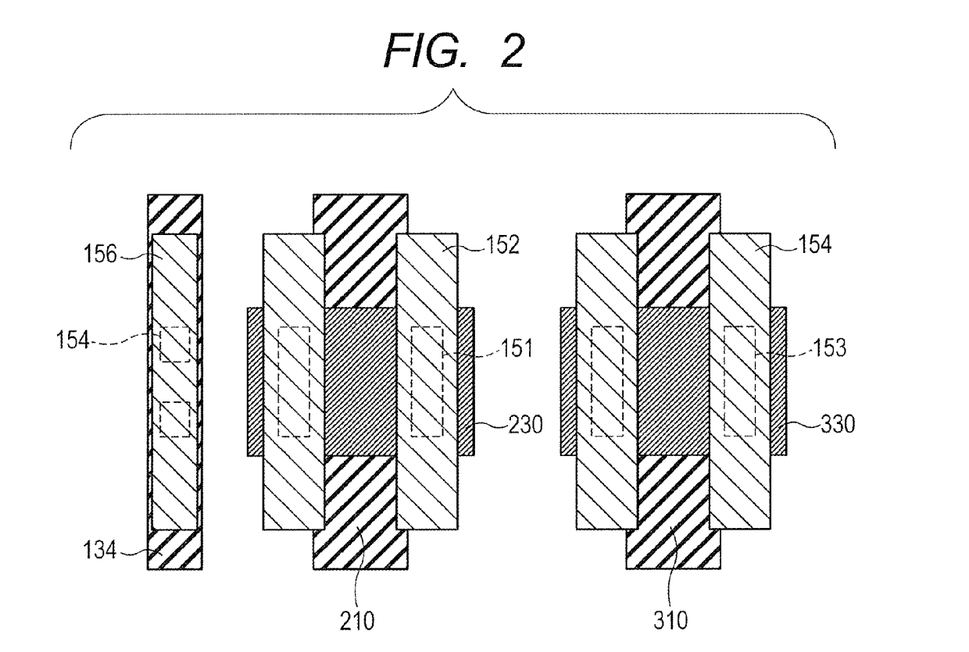
FIG. 2 is a plan view of a first transistor 200 shown in FIG. 1.

FIG. 2 is a plan view of the first transistor 200 shown in FIG. 1. In the example shown in FIG. 2, each of the first semiconductor layer 230 and the second semiconductor layer 330 has a rectangular shape. The two vias 151 are connected the first semiconductor layer 230 near the two shorter sides thereof. Further, the two vias 153 are connected to the second semiconductor layer 330 near the two shorter sides thereof.

FIG. 3 to FIG. 7 are cross sectional views showing a method of manufacturing the semiconductor device shown in FIG. 1. The method of manufacturing the semiconductor device has the following steps. At first, an interlayer insulating film 124 is formed. Successively, a first gate electrode 210 and a second gate electrode 310 are buried in the interlayer insulating film 124. Then, an anti-diffusion film 142 is formed over the interlayer insulating film 124, over the first gate electrode 210, and over the second gate electrode 310. Then, a first semiconductor layer 230 is formed over the anti-diffusion film 142 which is positioned over the gate electrode 210. Then, an insulating cover film 146 is formed on the upper surface and on the lateral side of the first semiconductor layer 230, and over the anti-diffusion film 142. Then, a semiconductor film 334 is formed over the insulating cover film 146. Then, the semiconductor film 334 is selectively removed to leave a portion positioned over the second gate electrode thereby forming a second semiconductor layer 330. Details are to be described below.

Figure 3:
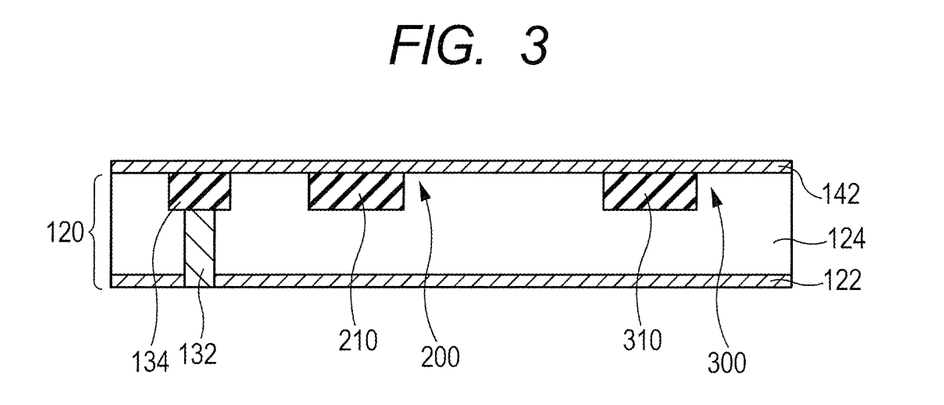
FIG. 3 is a cross sectional view showing a manufacturing method of the semiconductor device shown in FIG. 1.

At first, as shown in FIG. 3, transistors, etc. are formed in a semiconductor substrate (not illustrated) and, further, an interconnect layer in the lower layer (not illustrated) is formed over the semiconductor substrate. Then, an anti-diffusion film 122 is formed over the interconnect layer. Then, an interlayer insulating film 124 is formed over the anti-diffusion film 122. Then, a via hole and an interconnect trench are formed in the interlayer insulating film 124.

Then, a barrier metal film (not illustrated) is formed, optionally to the bottom and the side wall of the via hole and the interconnect trench and over the interlayer insulating film 124. The barrier metal film is formed, for example, by using a sputtering method. Then, a metal film (for example, copper film) is formed in the via hole and the interconnect trench and over the interlayer insulating film 124, for example, by using a plating method. Then, the metal film and the barrier metal film over the interlayer insulation 124 are removed by using, for example, a CMP method. Thus, a first interconnect layer 120 is formed. The first interconnect layer 120 includes a via 132, an interconnect 134, a first gate electrode 210, and a second gate electrode 310.

Then, an anti-diffusion film 142 is formed over the first interconnect layer 120. The anti-diffusion film 142 is formed by using, for example, a CVD method.

Figure 4:
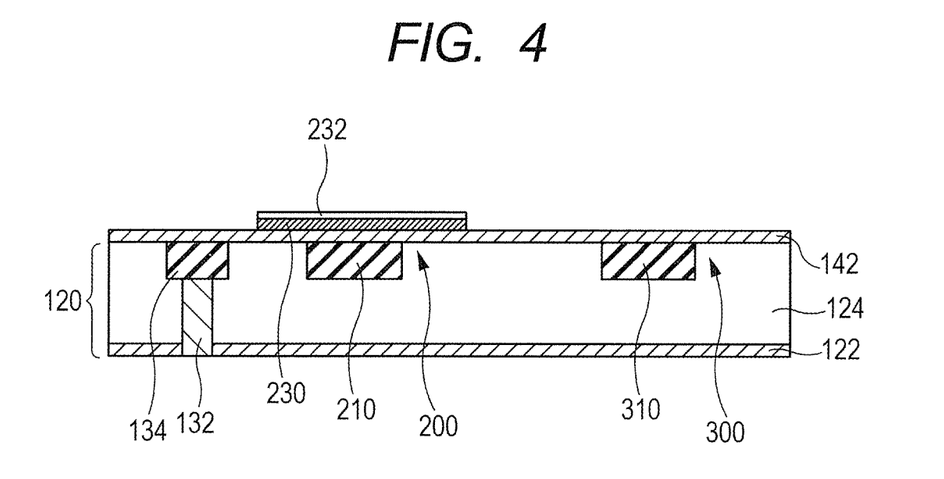
FIG. 4 is a cross sectional view showing the manufacturing method of the semiconductor device shown in FIG. 1.

Then, as shown in FIG. 4, a semiconductor layer is formed over the anti-diffusion film 142. When the semiconductor layer contains an oxide semiconductor layer, the semiconductor layer is formed, for example, by a sputtering method. In this step, the semiconductor substrate is heated to a temperature of 400° C. or lower. Further, when the semiconductor layer is a polysilicon layer or an amorphous silicon layer, the semiconductor layer is formed, for example, by a plasma CVD method.

Then, a hard mask 232 is formed over the semiconductor layer. Then, a resist pattern is formed over the hard mask 232 and the hard mask 232 is etched by using the resist pattern as a mask. Thus, the hard mask 232 is fabricated into a predetermined pattern. Then, the resist pattern is removed. Then, the semiconductor layer is etched by using the hard mask 232 as a mask. Thus, the first semiconductor layer 230 is formed.

Then, a source and a drain are formed to the semiconductor layer 230.

Figure 5:
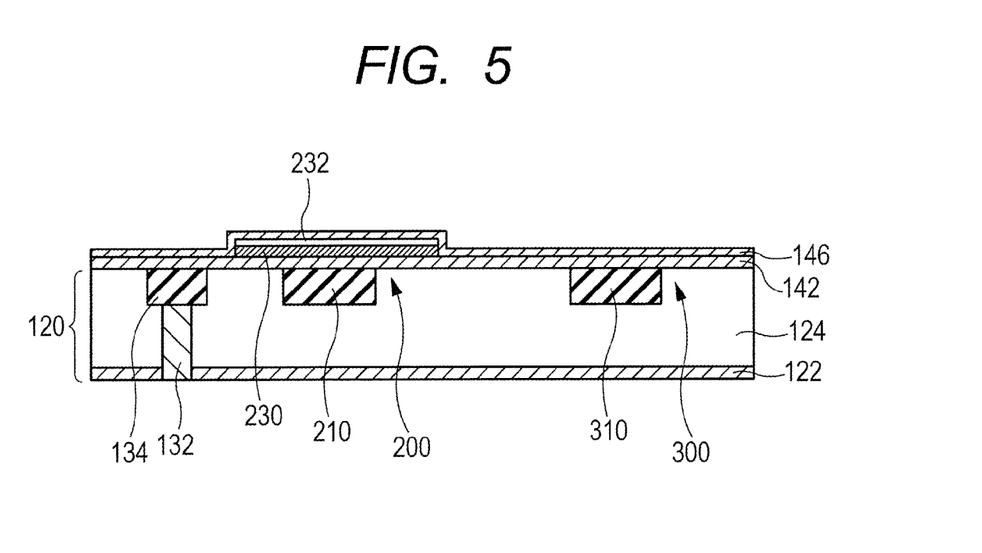
FIG. 5 is a cross sectional view showing the manufacturing method of the semiconductor device shown in FIG. 1.

Then as shown in FIG. 5, an insulating cover film 146 is formed over the hard mask 232 and over the anti-diffusion film 142. The insulating cover film 146 is formed, for example, by a CVD method. In this step, the insulating cover film 146 also covers the lateral side of the first semiconductor layer 230.

Figure 6:
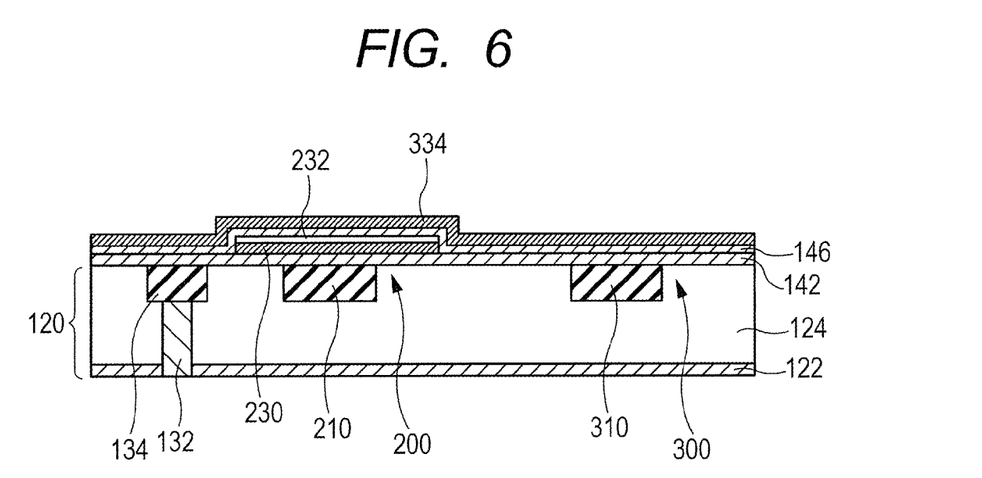
FIG. 6 is a cross sectional view showing the manufacturing method of the semiconductor device shown in FIG. 1.

Then, as shown in FIG. 6, a semiconductor film 334 is formed over the insulating cover film 146. The semiconductor film 334 is formed of a material different from that of the first semiconductor layer 230. In this step, the insulating cover film 146 is positioned between the first semiconductor layer 230 and the semiconductor film 334. Accordingly, direct contact between the first semiconductor layer 230 and the semiconductor film 334 can be prevented.

Figure 7:
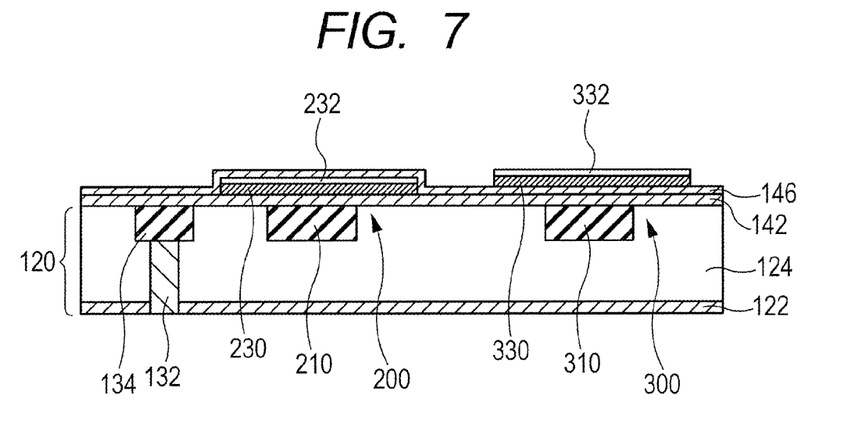
FIG. 7 is a cross sectional view showing the manufacturing method of the semiconductor device shown in FIG. 1.

Then, as shown in FIG. 7, a hard mask 332 is formed over the semiconductor film 334. Then, a resist pattern is formed over the hard mask 332, and the hard mask 332 is etched by using the resist pattern as a mask. Thus, the hard mask 332 is fabricated into a predetermined pattern. Then, the resist pattern is removed. Then, the semiconductor film 334 is etched by using the hard mask 332 as a mask. Thus, the second semiconductor layer 330 is formed.

Then, a source and a drain are formed to the semiconductor layer 330.

Then, an interlayer insulating film 144 is formed over the insulating cover film 146 and the hard mask 332. Then, via holes and interconnect trenches are formed in the interlayer insulating film 144. In the step of forming the via holes in the interlayer insulating film 144, the hard masks 232 and 332 also function as an etching stopper.

The step of forming the source and the drain to the first semiconductor layer 230 and the step of forming the source and the drain to the second semiconductor layer 330 may be performed in this stage. For example, the source and the drain are formed to the first semiconductor layer 230 and the second semiconductor layer 330 by performing a treatment of reductive plasma (for example, hydrogen plasma) or a treatment of nitrogen-containing plasma (for example, ammonia plasma)

to regions of the first semiconductor layer 230 and the second semiconductor layer 330 exposed to the bottom of the via holes.

Then, a barrier metal film is formed optionally at the bottom and on the side wall of the via holes and the interconnect trenches, as well as over the interlayer insulating film 144. The barrier metal film is formed, for example, by using a sputtering method. Then, a metal film is formed in the via holes and the interconnect trenches, and over the interlayer insulating film 144, for example, by a plating method. Then, the metal film and the barrier metal film over the interlayer insulating film 144 are removed, for example, by using a CMP method. Thus, the second interconnect layer 140 is formed. The second interconnect layer 140 includes interconnects 152, 154, and 156 and vias 151, 153, and 155. Thus, the semiconductor device shown in FIG. 1 is formed.

As described above, according to this embodiment, an insulating cover film 146 is formed over the upper surface and on the lateral side of the first semiconductor layer 230 after forming the first semiconductor layer 230 and before forming the semiconductor film 334. Accordingly, this can prevent contact between the first semiconductor layer 230 and the semiconductor film 334, which may otherwise change the characteristics of the semiconductor layer.

Further, the gate insulating film of the first transistor 200 is the anti-diffusion film 142, while the gate insulating film of the second transistor 300 comprises a stacked structure of the anti-diffusion film 142 and the insulating cover film 146. Accordingly, the thickness of the gate insulating film of the first transistor 200 and the thickness of the gate insulating film of the second transistor 300 can be controlled independently of each other. For example, in the embodiment shown in FIG. 1, the thickness of the gate insulating film of the second transistor 300 is made larger than the gate insulating film of the first transistor 200.

Second Embodiment

Figure 8:
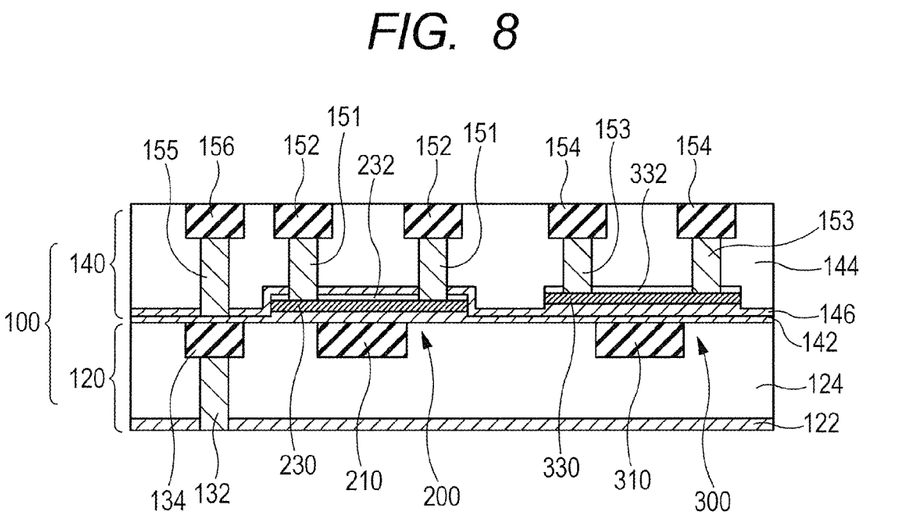
FIG. 8 is a cross sectional view showing a configuration of a semiconductor device according to a second embodiment.

FIG. 8 is a cross sectional view showing a configuration of a semiconductor device according to a second embodiment. The second semiconductor device has the same configuration as that of the semiconductor device according to the first embodiment except for the following points.

At first, the thickness of a portion of the anti-diffusion film 142 not covered by the first semiconductor layer 230 is less than the thickness of a portion covered by the first semiconductor layer 230. This is because the portion of the anti-diffusion film 142 not covered by the first semiconductor layer 230 is etched when the first semiconductor layer 230 is removed selectively.

Further, the thickness of the portion of the insulating cover film 146 not covered by the second semiconductor layer 330 is less than the thickness of a portion covered by the second semiconductor layer 330. This is because a portion of the insulating cover film 146 not covered by the second semiconductor layer 330 is etched when the second semiconductor layer 330 is removed selectively.

Also in this embodiment, the same effect as that of the first embodiment can be obtained. Further, the thickness of the portion of the anti-diffusion film 142 that functions as the gate insulating film of the second transistor 300 is decreased when the first semiconductor layer 230 is removed selectively. On the contrary, the gate insulating film of the second transistor 300 is a stacked film of the anti-diffusion film 142 and the insulating cover film 146. Accordingly, this can suppress that the gate insulating film of the second transistor 300 is excessively thin.

Third Embodiment

Figure 9:
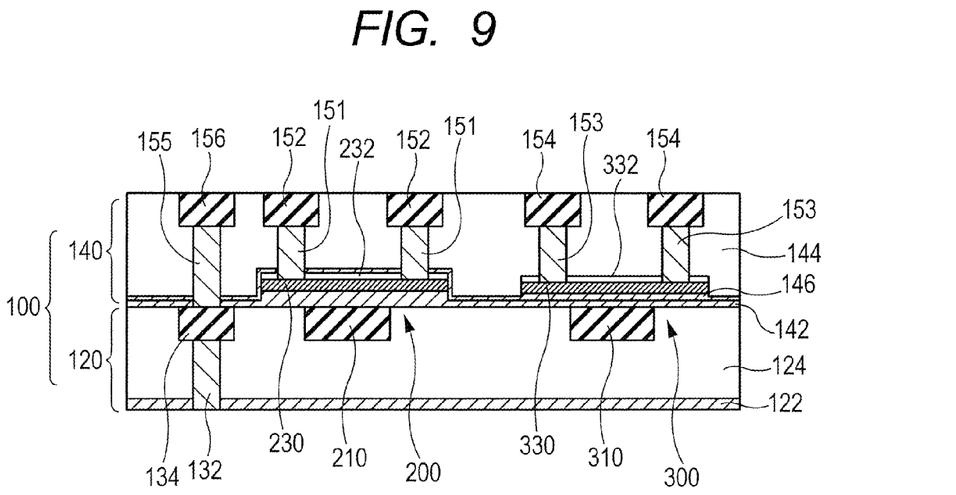
FIG. 9 is a cross sectional view showing a configuration of a semiconductor device according to a third embodiment.

FIG. 9 is a cross sectional view showing a configuration of a semiconductor device according to a third embodiment. The semiconductor device has the same configuration as that of the semiconductor device according to the second embodiment excepting that the thickness of the gate insulating film of the first transistor 200 is larger than the thickness of the gate insulating film of the second transistor 300.

Such a configuration can be obtained, for example, as described below. At first, the thickness of the anti-diffusion film 142 is increased to some extent and the amount of etching for the portion of the anti-diffusion film 142 not covered by the first semiconductor layer 230 is increased. Further, the thickness of the insulating cover film 146 is decreased.

Also in this embodiment, the same effect as that of the second embodiment can be obtained. Further, since the thickness of the gate insulating film of the first transistor 200 can be made larger than the thickness of the gate insulating film of the second transistor 300, the degree of freedom for the circuit design is improved.

Fourth Embodiment

Figure 10:
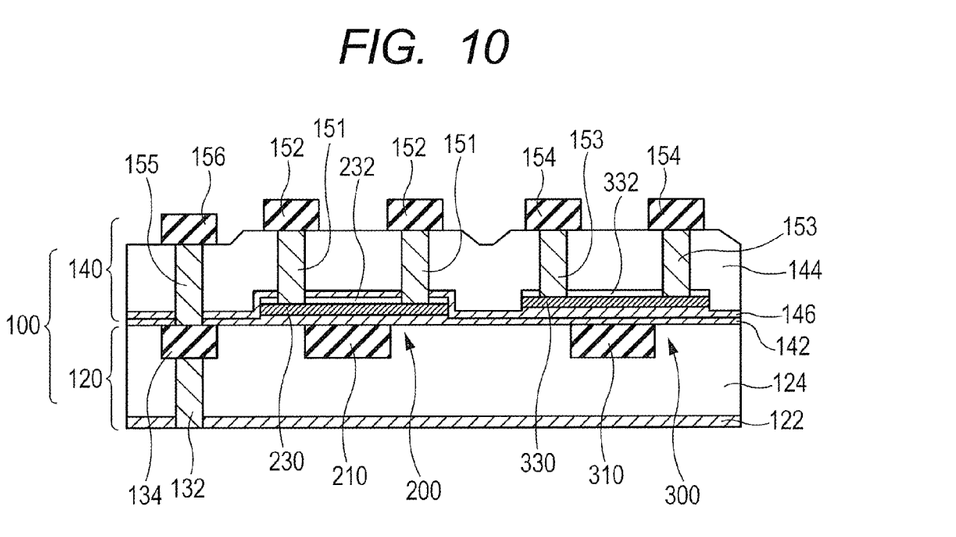
FIG. 10 is a cross sectional view showing a configuration of a semiconductor device according to a fourth embodiment.

FIG. 10 is a cross sectional view showing a configuration of a semiconductor device according to a fourth embodiment. The semiconductor device has the same configuration as that of the semiconductor device according to any one of the first to third embodiments excepting that each of the interconnect 152, 254, and 256 of the second interconnect layer 140 comprise an Al interconnect.

FIG. 10 shows a case identical with the second embodiment.

Specifically, the interconnect 152, 154, and 156 are positioned over an interlayer insulating film 144. Further, the vias 151, 153, and 155 may be formed integrally with the interconnects 152, 154, and 156 (that is with Al), or may be formed of tungsten. The second interconnect layer 140 may also include an electrode pad.

Also in this embodiment, the same effect as that of the first to third embodiments can be obtained.

Fifth Embodiment

FIG. 11 to FIG. 14 are cross sectional view showing a method of manufacturing a semiconductor device according to a fifth embodiment. The semiconductor device manufactured by the method has the same configuration as that of the semiconductor device according to the first to fourth embodiments excepting the following points. FIG. 11 to FIG. 14 show a case identical with the first embodiment.

At first, a first opening 143 is formed in the portion of the anti-diffusion film 142 that overlaps the first gate electrode 210 and the periphery thereof. Then, a gate insulating film 231 is deposited between the first semiconductor layer 230 and the first gate electrode 210. That is, in this embodiment, the gate insulating film 231 of the first transistor 200 is formed of a film different from the anti-diffusion film 142. The material forming the gate insulating film 231 has a higher specific dielectric constant than the material forming the anti-diffusion film 142. For example, the gate insulating film 231 includes an SiN layer, a composite metal oxide layer having a perovskite structure, or a layer of oxide of one or more metals selected from Si, Al, Hf, Zr, Ta, and Ti. Further, the thickness of the gate insulating film 231 is less than that of the anti-diffusion film 142. The thickness of the gate insulating film 231 is, for example, 5 nm or more and 100 nm or less.

Further, the planar shape of the gate insulating film 231 and the first semiconductor layer 230 is larger than the planar shape of the first opening 143. That is, portions of the gate insulating film 231 and the first semiconductor layer 230 are positioned over the anti-diffusion film 142.

Figure 11:
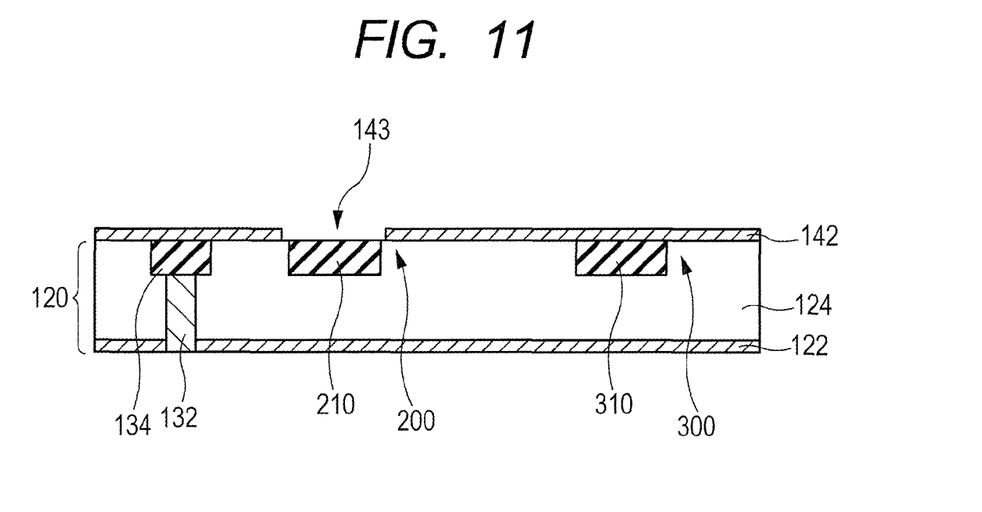
FIG. 11 is a cross sectional view showing a method of manufacturing a semiconductor device according to a fifth embodiment.

Then, a method of manufacturing the semiconductor device is to be described. At first, as shown in FIG. 11, an anti-diffusion film 122, an interlayer insulating film 124, a via 132, an interconnect 134, a first gate electrode 210, a second gate electrode 310, and an anti-diffusion film 142 are formed. The method of forming them is identical with that of the first embodiment.

Then, a mask pattern (not illustrated) is formed over the anti-diffusion film 142 and the anti-diffusion film 142 is etched by using the mask pattern as a mask. Thus, the first opening 143 is formed in the anti-diffusion film 142. The first gate electrode 210 is exposed from the bottom of the first opening 143. Then, the mask pattern is removed.

Figure 12:
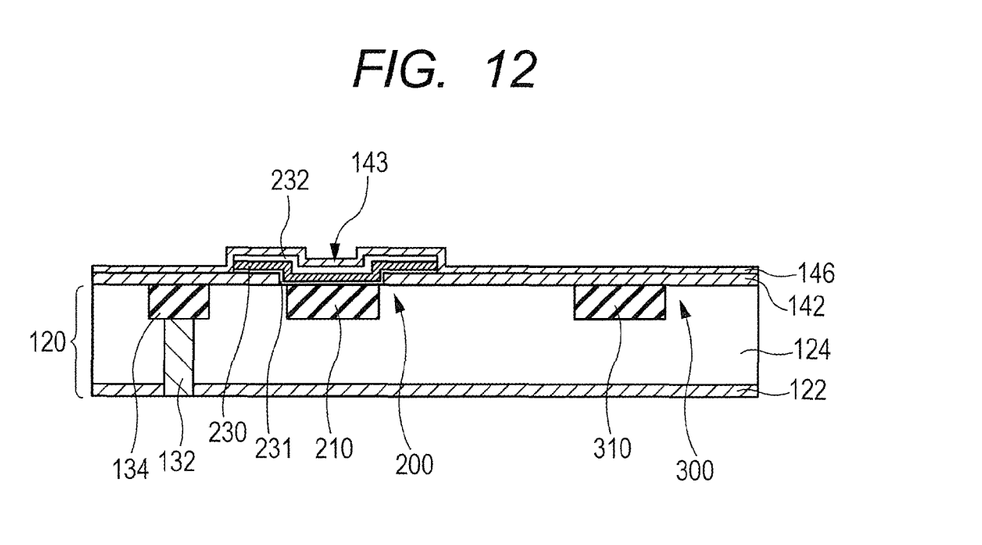
FIG. 12 is a cross sectional view showing a method of manufacturing the semiconductor device according to the fifth embodiment.

Then, as shown in FIG. 12, a gate insulating film 231, a first semiconductor layer 230, and a hard mask 232 are formed in this order over the anti-diffusion film 142 and in the first opening 143. Then, after fabricating the hard mask 132 to a predetermined pattern, a stacked film of the gate insulating film 231 and the first semiconductor layer 230 is etched by using the hard mask 232 as a mask. Thus, the gate insulating film 231 and the first semiconductor layer 230 are formed into a predetermined pattern. Then, an insulating cover film 146 is formed over the anti-diffusion film 142 and over the hard mask 232.

Figure 13:
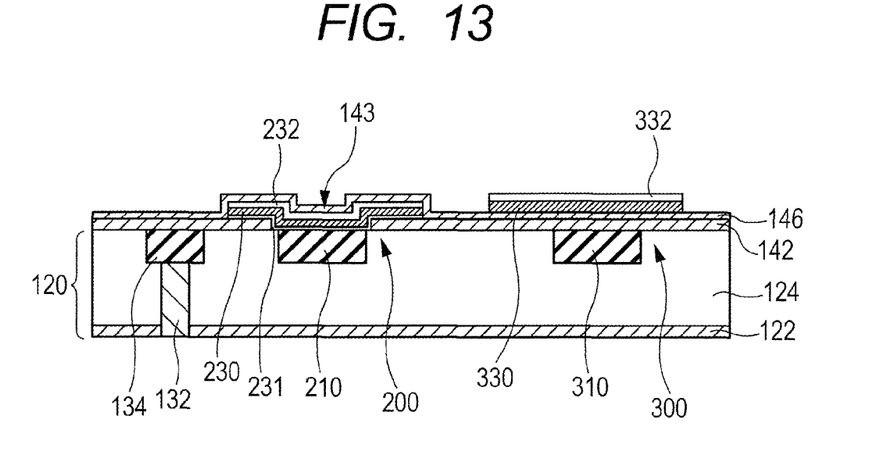
FIG. 13 is a cross sectional view showing a method of manufacturing the semiconductor device according to the fifth embodiment.

Then, as shown in FIG. 13, a second semiconductor layer 330 and a hard mask 332 are formed. The method of forming them is identical with that of the first embodiment.

Figure 14:
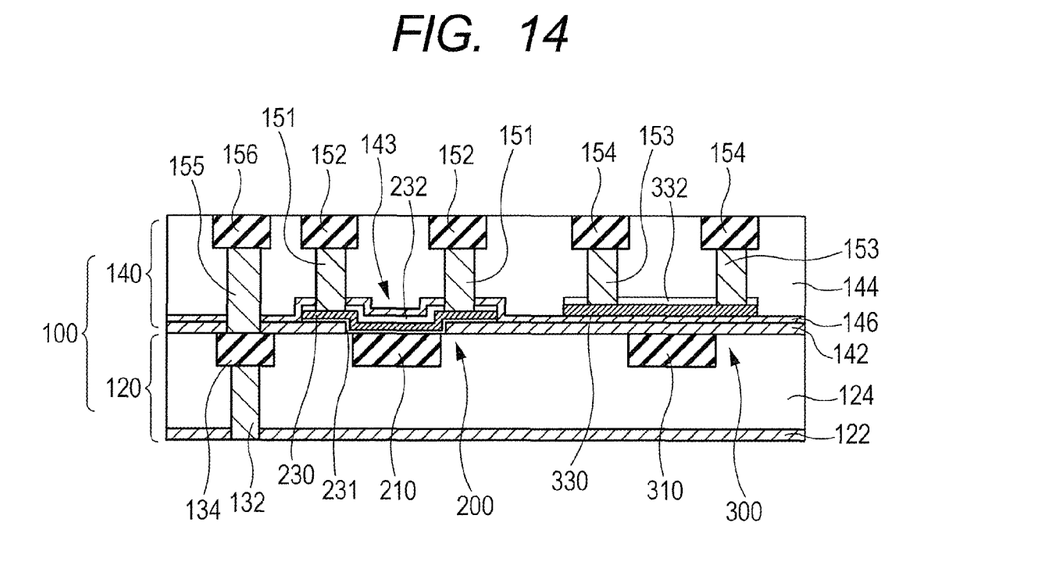
FIG. 14 is a cross sectional view showing a method of manufacturing the semiconductor device according to the fifth embodiment.

Then, as shown in FIG. 14, an interlayer insulating film 144, vias 151, 153, and 155, and interconnects 152, 154, and 156 are formed. The method of forming them is also identical with that of the first embodiment.

Also in this embodiment, the same effect as that of the first embodiment can be obtained. Further, the gate insulating film 231 of the first transistor 200 is formed of a film different from the anti-diffusion film 142. Accordingly, the range for controlling the dielectric constant of the gate insulating film is extended.

Sixth Embodiment

Figure 15:
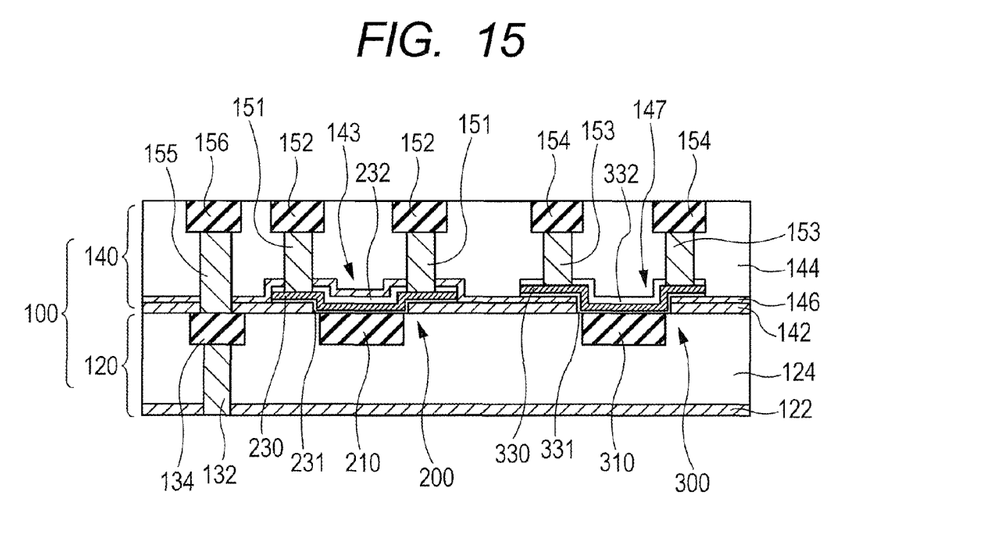
FIG. 15 is a cross sectional view showing a configuration of a semiconductor device according to a sixth embodiment.

FIG. 15 is a cross sectional view showing a configuration of a semiconductor device according to a sixth embodiment. The semiconductor device has the same configuration as that of the semiconductor device according to the fifth embodiment except for the following points.

At first, a second opening 147 is formed in the portion of a stacked film of an anti-diffusion film 142 and an insulating cover film 146 that overlaps a second gate electrode 310 and the periphery thereof. Then, a gate insulating film 331 is deposited between a second semiconductor layer 330 and the second gate electrode 310. That is, in this embodiment, the gate insulating film 331 of a second transistor 300 is formed of a material different from that of the anti-diffusion film 142. The material forming the gate insulating film 331 has a specific dielectric constant higher than that of the material forming the anti-diffusion film 142. For example, the gate insulating film 331 contains an SiN layer, a composite metal oxide layer having a perovskite structure, or a layer of oxide of one or more metals selected from Si, Al, Hf, Zr, Ta, and Ti. Further, the thickness of the gate insulating film 331 is less than that of the anti-diffusion film 142. The thickness of the gate insulating film 331 is, for example, 5 nm or more and 100 nm or less.

Further, the planar shape of the gate insulating film 331 and the second semiconductor layer 330 is larger than the planar shape of the second opening 147. That is, portions of the gate insulating film 331 and the second semiconductor layer 330 are positioned over the insulating cover film 146.

Figure 16:
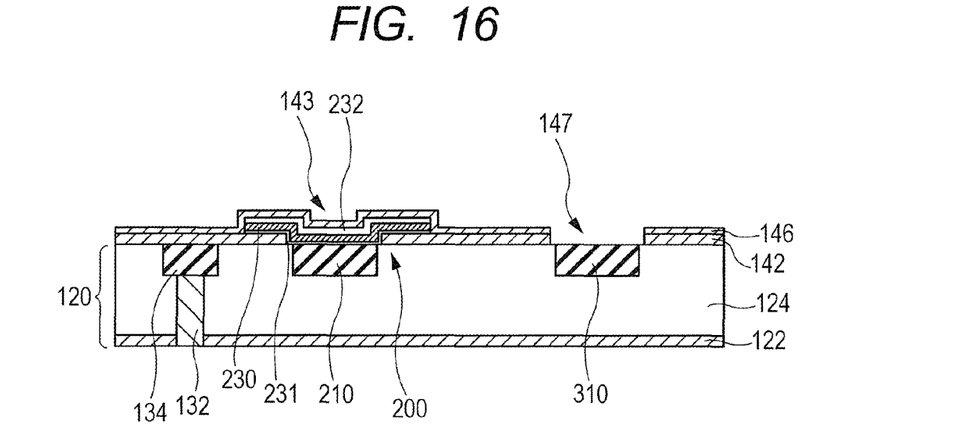
FIG. 16 is a cross sectional view showing a method of manufacturing the semiconductor device according to the sixth embodiment.

The method of manufacturing the semiconductor device is to be described with reference to FIG. 15 and FIG. 16. At first, as shown in FIG. 16, an anti-diffusion film 122, an interlayer insulating film 124, a via 132, an interconnect 134, a first gate electrode 210, a second gate electrode 310, an anti-diffusion film 142, a first opening 143, a gate insulating film 231, a first semiconductor layer 230, a hard mask 232, and an insulating cover film 146 are formed. The method of forming them is identical with that of the fifth embodiment.

Then, a mask pattern (not illustrated) is formed over the insulating cover film 146 and a stacked film of the insulating cover film 146 and the anti-diffusion film 142 is etched by using the mask pattern as a mask. Thus, a second opening 147 is formed in the insulating cover film 146 and the anti-diffusion film 142. The second gate electrode 310 is exposed from the bottom of the second opening 147. Then, the mask pattern is removed.

Then, as shown in FIG. 15, a gate insulating film 331, a semiconductor film 334, and a hard mask 332 are formed in this order over the insulating cover film 146 and in the second opening 147. Then, after fabricating the hard mask 332 into a predetermined pattern, the stacked film of the gate insulating film 331 and the semiconductor film 334 is etched by using the hard mask 332 as a mask. Thus, the gate insulating film 331 is formed into a predetermined pattern, and the second semiconductor layer 330 is formed.

Then, interlayer insulating film 144, vias 151, 153, and 155, and interconnects 152, 154, and 156 are formed. The method of forming them is identical with that of the fifth embodiment.

Also in this embodiment, the same effect as that of the fifth embodiment can be obtained. Further, the gate insulating film 331 of the second transistor 300 is formed of a film different from the anti-diffusion film 142 and the insulating cover film 146. Accordingly, the range of controlling the dielectric constant of the gate insulating film 331 is extended.

Seventh Embodiment

Figure 17:
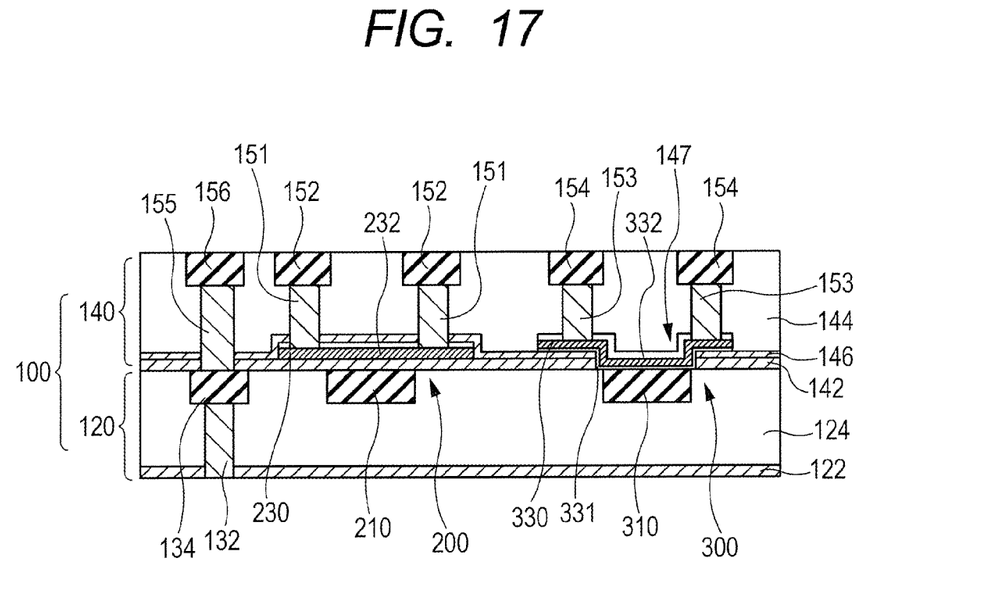
FIG. 17 is a cross sectional view showing a configuration of a semiconductor device according to a seventh embodiment.

FIG. 17 is a cross sectional view showing a configuration of a semiconductor device according to a seventh embodiment. The semiconductor device has the same configuration as that of the semiconductor device according to the sixth embodiment excepting that the first transistor 200 has the same configuration as that of the first to third embodiments. The method of manufacturing the semiconductor device is identical with that of the semiconductor device according to the sixth embodiment excepting that the first opening 143 and gate insulating film 231 are not formed.

Also in this embodiment, the same effect as that of the first embodiment can be obtained. Further, the gate insulating film 331 of the second transistor 300 is formed of a material different from that of the anti-diffusion film 142 and the insulating cover film 146. Therefore, the range of controlling the dielectric constant of the gate insulating film 331 is extended.

Eighth Embodiment

Figure 18:
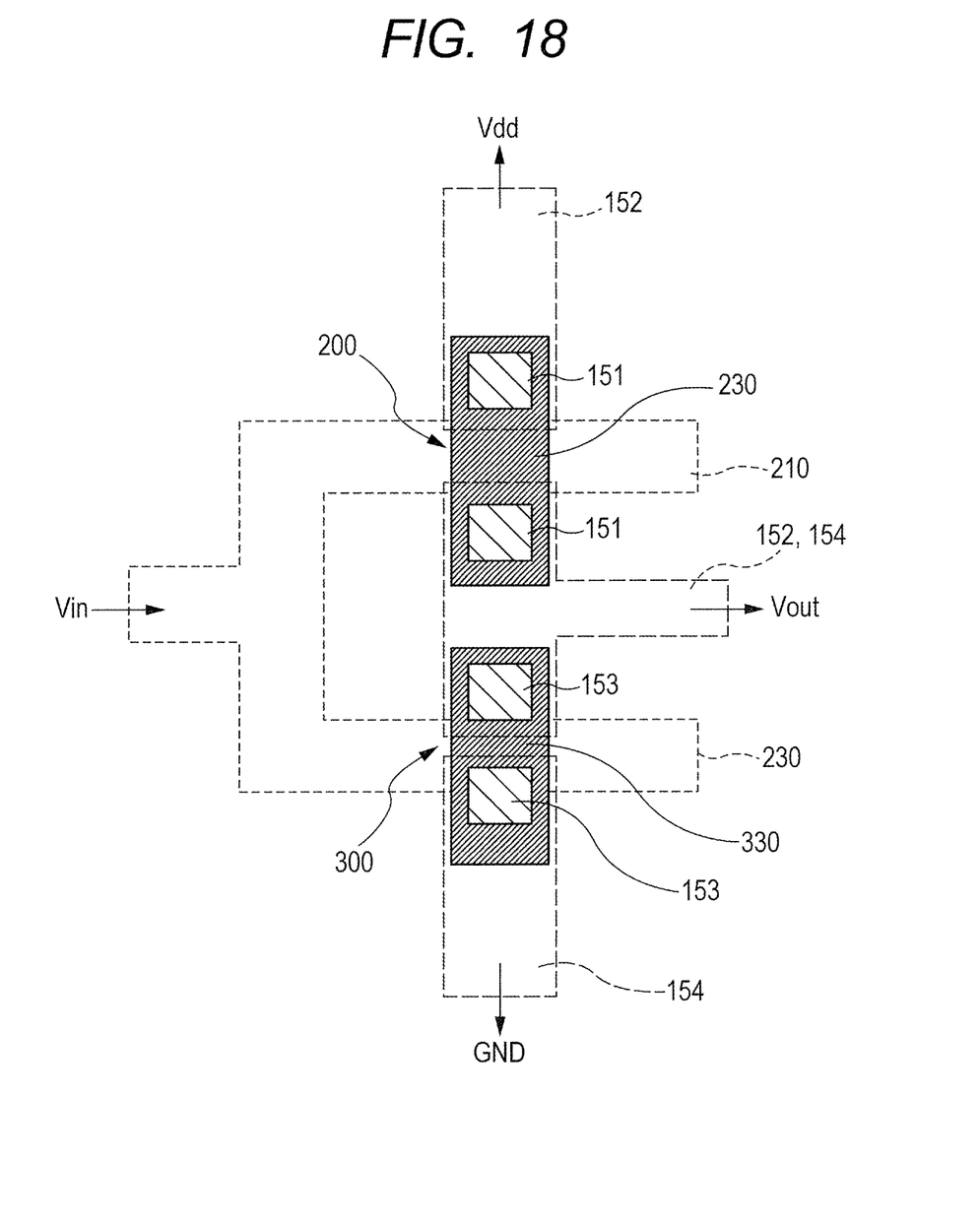
FIG. 18 is a planar view showing a configuration of a semiconductor device according to an eighth embodiment.
Figure 19:
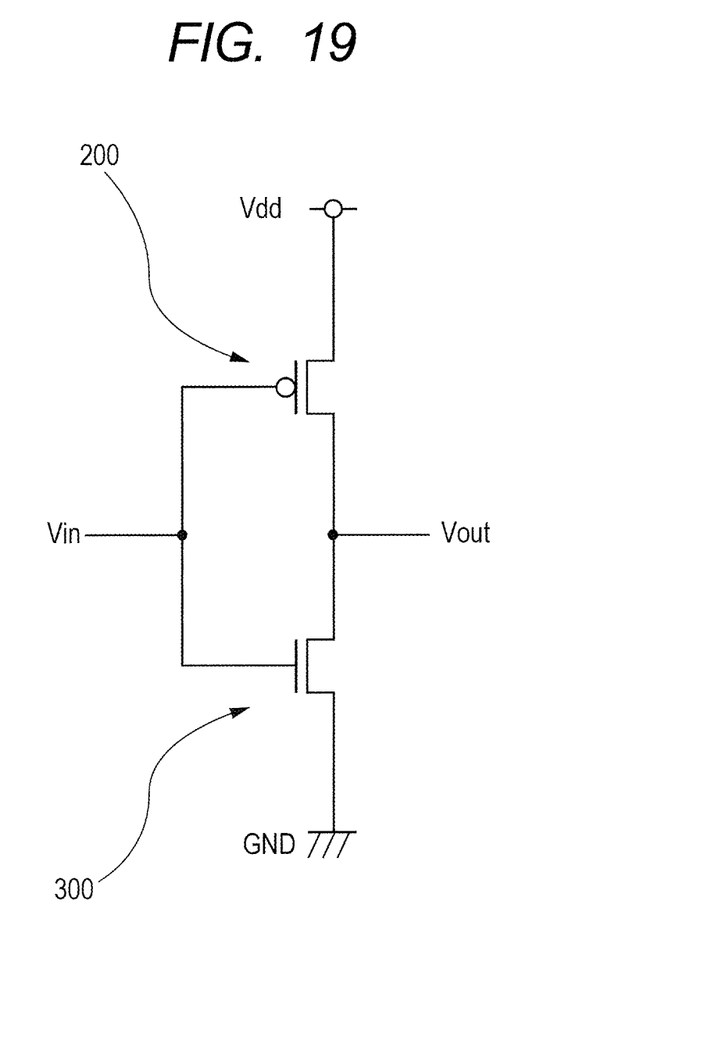
FIG. 19 is a circuit diagram of the semiconductor device shown in FIG. 18.

FIG. 18 is a plan view showing a configuration of a semiconductor device according to an eighth embodiment. FIG. 19 is a circuit diagram of the semiconductor device shown in FIG. 18. The semiconductor device has an inverter circuit. The inverter circuit comprises the first transistor 200 and a second transistor 300. In the example shown in FIG. 18, the first transistor 200 is a p-type transistor and the second transistor 300 is an n-type transistor. Alternatively, both of the first transistor 200 and the second transistor 300 may be an n-type transistor.

That is, a first gate electrode 210 of the first transistor 200 and the second gate electrode 310 of the second transistor 300 are connected to an identical interconnect and a control signal $V_{in}$ identical to each other is inputted.

A first semiconductor 230 of the first transistor 200 is connected by way of a via 151 and an interconnect 152 on one side to a power source interconnect ($V_{dd}$), and connected to the output interconnect by way of a via 151 and an interconnect 152 on the other side. Further, the second semiconductor layer 330 of the second transistor 300 is connected to a ground interconnect (GND) by way of a via 153 and an interconnect 154 on one side and connected to the output interconnect by way of the via 153 and the interconnect 154 on the other side.

According to this embodiment, an inverter circuit can be formed by using the first transistor 200 and the second transistor 300 formed in one identical interconnect layer.

Ninth Embodiment

Figure 20:
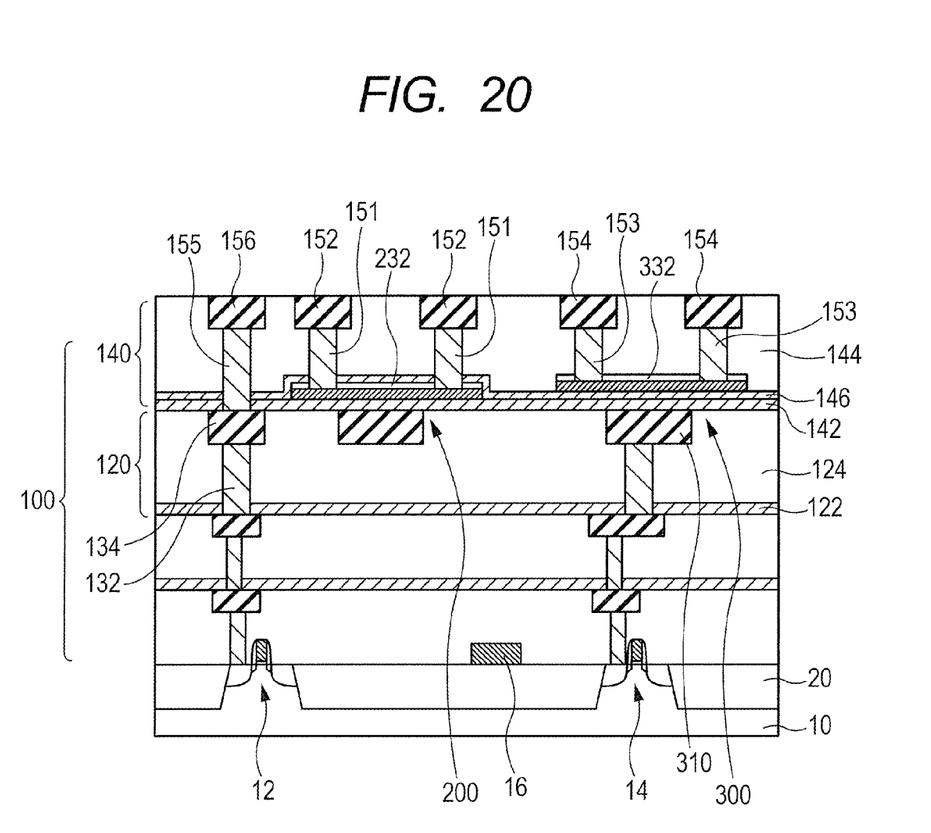
FIG. 20 is a cross sectional view showing a configuration of a semiconductor device according to a ninth embodiment.

FIG. 20 is a cross sectional view showing a configuration of a semiconductor device according to a ninth embodiment. The semiconductor device has a semiconductor substrate 10 and a multilayer interconnect layer 100.

A device isolation film 20 and transistors 12 and 14 are formed to the semiconductor substrate 10. Further, a passive element (for example, resistance element) 16 is formed over the element isolation film 20. The passive element 16 is formed by a step identical with that of the gate electrode of the transistor 12.

The first transistor 200 and the second transistor 300 shown in one of the first to eighth embodiments are formed in the first interconnect layer 120 and the second interconnect layer 140 of the multilayer interconnect layer 100. In the example shown in FIG. 20, the first transistor 200 and the second transistor 300 shown in the first embodiment (FIG. 1) are formed. The planar shape of the first transistor 200 is larger than the planar shape of the transistors 12 and 14.

The multilayer interconnect layer 100 has a local interconnect layer and a global interconnect layer. The local interconnect layer is an interconnect layer for forming a circuit. The global interconnect layer is an interconnect layer for extending a power source interconnect and a ground interconnect. The thickness of each of the interconnect layers forming the local interconnect layer is less than the thickness of the interconnect layer forming the global interconnect layer. Then, the thickness of each of the interconnects of the local interconnect layer is less than the thickness of each of the interconnects of the global interconnect layer. The first interconnect layer 120 and the second interconnect layer 140 may be positioned in the local interconnect layer or positioned in the global interconnect layer.

The drain (or source) of the transistor 12 is connected by way of the interconnect and the via formed in the multilayer interconnect layer 100 to the second gate electrode 310 of the second transistor 300 to the via 132. The drain of the transistor 14 is connected by way of the interconnect and the via formed in the multilayer interconnect layer 100 to the second electrode gate 310 of the second transistor 300. Other transistor formed in the semiconductor substrate 10 may be connected to the first gate electrode 210 of the first transistor 200. The transistors 12 and 14 form an internal circuit of the semiconductor device. The transistor 14 overlaps the second semiconductor layer 330 of the second transistor 300 in a plan view.

According to this embodiment, the first transistor 200 and the second transistor 300 can be overlapped with the transistors 12 and 14 in a plan view. Accordingly, the degree of integration of the transistor can be improved to decrease the size of the semiconductor device.

The preferred embodiments of the invention have been described with reference to the drawings, but they are examples of the invention and various other configurations than those described above can also be adopted.

What is claimed is:

1. A semiconductor device comprising:
a multilayer interconnect layer having a first interconnect layer and a second interconnect layer positioned over the first interconnect layer; and
a first transistor and a second transistor formed by using the first interconnect layer,
wherein the first transistor includes:
a first gate electrode buried in the first interconnect layer;
a first gate insulating film positioned over the first gate electrode;
a first semiconductor layer positioned over the first gate insulating film; and
an insulating cover film positioned below the second interconnect layer and covering the upper surface and the lateral side of the first semiconductor layer, and
wherein the second transistor includes:
a second gate electrode buried in the first interconnect layer;
a second gate insulating film positioned over the second gate electrode; and
a second semiconductor layer positioned over the second gate insulating film, positioned at least partially above the insulating cover film and formed of a material different from that of the first semiconductor layer.

2. The semiconductor device according to claim 1, wherein the multilayer interconnect layer has an anti-diffusion film positioned between the first interconnect layer and the second interconnect layer, and
wherein the first gate insulating film and the second gate insulating film contain the anti-diffusion film.

3. The semiconductor device according to claim 2, wherein the insulating cover film is positioned also below the semiconductor layer, and
wherein the second insulating film has the insulating cover film positioned below the second semiconductor layer.

4. The semiconductor device according to claim 1, wherein the multilayer interconnect layer has an anti-diffusion film positioned between the first interconnect layer and the second interconnect layer,
wherein the anti-diffusion film has a first opening positioned over the first gate electrode, and
wherein the first gate insulating film is positioned in the first opening.

5. The semiconductor device according to claim 1, wherein the multilayer interconnect layer has an anti-diffusion film positioned between the first interconnect layer and the second interconnect layer,
wherein the insulating cover film is formed also over the anti-diffusion film,
wherein a stacked film of the anti-diffusion film and the insulating cover film has a second opening positioned over the second gate electrode, and
wherein the second gate insulating film is positioned in the second opening.

6. The semiconductor device according to claim 1, wherein the film thickness is different between the first gate insulating film and the second gate insulating film.

7. The semiconductor device according to claim 1, wherein the conduction type of the first semiconductor layer and the second semiconductor layer is different from each other.

8. The semiconductor device according to claim 1,
wherein the conduction type of the first semiconductor layer and the second semiconductor layer is identical to each other.

9. A semiconductor device according to claim 1, wherein the insulating cover film contains one of SiN film, $SiO_2$ film, SiOC film, and SiOCH film.

10. The semiconductor device according to claim 2,
wherein the anti-diffusion film contains at least one of SiN film, SiCN film, and SiC film.

11. The semiconductor device according to claim 1,
wherein each of the first gate electrode and the second gate electrode comprises a Cu interconnect.

12. The semiconductor device according to claim 1,
wherein each of the first semiconductor layer and the second semiconductor layer comprises an oxide semiconductor layer.

13. The semiconductor device according to claim 12,
wherein the oxide semiconductor layer is, InGaZnO layer, InZnO layer, ZnO layer, ZnAlO layer, ZnCuO layer, NiO layer, SnO layer, $SnO_2$ layer, CuO layer, $Cu_2O$ layer, CuAlO layer, ZnO layer, ZnAlO layer, $Ta_2O_5$ layer, or $TiO_2$ layer.

* * * * *